United States Patent
Pickering et al.

(10) Patent No.: US 10,152,564 B2
(45) Date of Patent: Dec. 11, 2018

(54) METHODS AND SYSTEMS FOR GENERATING USER INTERFACE FOR PROCESSING BUILDING INFORMATION MODELING (BIM)-BASED DATA

(71) Applicant: Viewpoint, Inc., Portland, OR (US)

(72) Inventors: Lloyd Pickering, Durham (GB);
Andrew Thomson, Blaydon (GB);
Andrew Burden, Newcastle-upon-Tyne (GB)

(73) Assignee: Viewpoint, Inc., Portland, OR (US)

( * ) Notice: Subject to any disclaimer, the term of this patent is extended or adjusted under 35 U.S.C. 154(b) by 317 days.

(21) Appl. No.: 14/491,838

(22) Filed: Sep. 19, 2014

(65) Prior Publication Data

US 2015/0089344 A1    Mar. 26, 2015

Related U.S. Application Data

(60) Provisional application No. 61/880,370, filed on Sep. 20, 2013.

(51) Int. Cl.
| | |
|---|---|
| *G06F 17/50* | (2006.01) |
| *H04L 29/06* | (2006.01) |
| *G06F 3/0481* | (2013.01) |
| *G06F 17/30* | (2006.01) |
| *H04L 29/08* | (2006.01) |
| *G06F 3/0484* | (2013.01) |
| *G06F 17/24* | (2006.01) |

(52) U.S. Cl.
CPC ...... *G06F 17/5004* (2013.01); *G06F 3/04815* (2013.01); *G06F 3/04842* (2013.01); *G06F 17/246* (2013.01); *G06F 17/30289* (2013.01); *H04L 67/10* (2013.01); *H04L 67/42* (2013.01)

(58) Field of Classification Search
None
See application file for complete search history.

(56) References Cited

U.S. PATENT DOCUMENTS 6,971,063 B1 * 11/2005 Rappaport ............ H04L 41/145
   709/203
8,306,883 B2    11/2012 Allin et al.
(Continued)

FOREIGN PATENT DOCUMENTS

| EP | 2629210 A1 | 8/2013 |
|---|---|---|
| KR | 20100020060 A | 2/2010 |

OTHER PUBLICATIONS

Singh, V. et al., "A Theoretical Framework of a BIM-Based Multi-Disciplinary Collaboration Platform," Automation in Construction, vol. 20, No. 2, Mar. 2011, 11 pages.
(Continued)

*Primary Examiner* — Stephen S Hong
*Assistant Examiner* — Hope C Sheffield
(74) *Attorney, Agent, or Firm* — McCoy Russell LLP

(57) ABSTRACT

A method for operating a BIM system is provided. The method includes at a BIM server, generating a network accessible graphical user interface (GUI) simultaneously displaying a 3-dimensional rendering of a building model, a hierarchical structure of building model data, and a Construction Operations Building Information Exchange (CO-Bie) spreadsheet, the building model, hierarchical structure of building model data, and a COBie spreadsheet being associatively linked.

17 Claims, 14 Drawing Sheets

(56) References Cited

U.S. PATENT DOCUMENTS

| | | | |
|---|---|---|---|
| 8,400,467 B1 | 3/2013 | Ponce de Leon | |
| 2008/0071562 A1* | 3/2008 | Clemenson | G06Q 10/06 705/7.12 |
| 2008/0172208 A1 | 7/2008 | Lechine | |
| 2009/0144097 A1* | 6/2009 | Fassio | G06Q 10/10 705/307 |
| 2009/0248796 A1* | 10/2009 | Johnston | G06F 3/0488 709/203 |
| 2011/0078169 A1* | 3/2011 | Sit | G06Q 10/10 707/769 |
| 2012/0066178 A1 | 3/2012 | Omansky et al. | |
| 2012/0203806 A1* | 8/2012 | Panushev | G06Q 50/08 707/825 |
| 2012/0281013 A1* | 11/2012 | Mahdavi | G06F 17/50 345/619 |
| 2013/0073619 A1* | 3/2013 | Tumuluri | G06T 19/20 709/204 |
| 2013/0169681 A1 | 7/2013 | Rasane et al. | |
| 2013/0218924 A1 | 8/2013 | Kim et al. | |
| 2015/0088467 A1 | 3/2015 | Skoropinski et al. | |
| 2015/0088916 A1 | 3/2015 | Stokoe et al. | |
| 2015/0309578 A1* | 10/2015 | McCoy | G06F 3/017 715/863 |

OTHER PUBLICATIONS

Chuang, T. et al., "Applying Cloud Computing Technology to BIM Visualization and Manipulation," 28th International Symposium on Automation and Robotics in Construction: ISARC 2011, Jul. 2011, 6 pages.

European Patent Office, Extended European Search Report Issued in Application No. 14185267.3, dated Feb. 19, 2015, Germany, 7 pages.

AEC Magazine Website, "4Projects BIM in a Browser," Available at http://aecmag.com/technology-mainmenu-35/559-4projects-bim-in-a-browser, Published Apr. 9, 2013, 4 pages.

ISA Korean Intellectual Property Office, International Search Report and Written Opinion Issued in Application No. PCT/US2014/056597, dated Jan. 2, 2015, WIPO, 10 pages.

"Get Real with BIM," YouTube Video Uploaded by Kimon Onuma on Nov. 13, 2010, https://www.youtube.com/watch?v=RnHPj77Ig-I, 2 pages.

"Demystifying COBie Standards and How to Integrate Them Into BIM Based Applications," YouTube Video Uploaded by FiatechWebinars on Jun. 6, 2012, https://www.youtube.com/watch?v=vf010XZ-Y, 2 pages.

* cited by examiner

METHODS AND SYSTEMS FOR GENERATING USER INTERFACE FOR PROCESSING BUILDING INFORMATION MODELING (BIM)-BASED DATA

CROSS REFERENCE TO RELATED APPLICATION

This application claims priority to U.S. provisional patent application Ser. No. 61/880,370, entitled "PROCESSING BUILDING INFORMATION MODELING (BIM)-BASED DATA" filed on Sep. 20, 2013, the entire disclosure of which is herein incorporated by reference.

FIELD OF INVENTION

The present invention relates to managing Building Information Modeling (BIM) based data.

BACKGROUND

Building Information Modeling (BIM) is a digital representation of physical and functional characteristics of a facility. A BIM is a shared knowledge resource for information about a facility forming a reliable basis for decisions during its life-cycle. In addition to the geometry of a facility, BIM data can also describe additional information, such as spatial relationships, light analysis, geographic information, and quantities and properties of building components (e.g., manufacturers' details).

It is known to provide collaborative BIM software tools that enable several users, including ones at geographically remote sites, to work on the same BIM-based project (e.g., building model). An exemplary BIM based project platform is 4BIM, produced by 4Projects. This can allow any project member to review and interact with 3-dimensional building models using a World Wide Web browser. In some instances, it is desirable for one user to manipulate the BIM-based data in a certain way (e.g., modify an image of the facility represented by the data), and for the other users to watch that manipulation substantially in real time, or at least with reduced (e.g., minimal) delay. Conventionally, this type of "screen sharing" involves taking a sequence of snapshots/images of the "master" screen and sending bitmap data representing those to each client over a network such as the Internet. There are known techniques to reduce the amount of data sent to the devices, such as detecting what has changed since the last image was generated and only sending that portion of the image, but such conventional techniques still ultimately rely on streaming image data at a minimum rate of approximately 10 per second and in many cases 24/25/30 per second. Moreover, it may be desirable for the users to view other information pertaining to building models, such as COBie data corresponding to specific objects within the model. However, 4BIM does not provide such functionality. Therefore, the users may have to access additional programs locally or remotely to facilitate viewing of other related data, such as COBie data, decreasing the efficiency of data management. In some cases, a user may have to use multiple computing devices to provide access to a building model as well as COBie data.

SUMMARY OF THE INVENTION

Embodiments of the present invention are intended to address at least some of the abovementioned problems. Additionally, one of the goals of the systems and methods described herein is to provide tools and concepts in BIM data management software that improve processing efficiency of computing devices in the system as well as user interaction and productivity. As such in one approach, a method for operating a BIM system is provided. The method includes, at a BIM server, generating a network accessible graphical user interface (GUI) simultaneously displaying a 3-dimensional rendering of a building model, a hierarchical structure of building model data, and a Construction Operations Building Information Exchange (COBie) spreadsheet, the building model, hierarchical structure of building model data, and a COBie spreadsheet being associatively linked. In this way, a plurality of users having network access may simultaneously view a 3-dimenional building model as well as corresponding COBie data, a hierarchical data structure pertaining to the model. Furthermore, the users are provided with pertinent information pertaining to the features of the building model they are viewing, manipulating, etc. As a result, the productivity of the users is increased. Moreover, providing a single GUI presenting the building model hierarchical structure, and COBie spreadsheet increases processing efficiency when compared to system which may display the aforementioned elements at different time intervals. For instance, when a model and corresponding data are already open the same model doesn't have to be reloaded for other users at overlapping time intervals. This is particularly useful for shared session scenarios. Furthermore, in the aforementioned system data changes can be sent to every active user so the model doesn't have to be reloaded or the entire model refreshed for each user.

In one example, the method may further include altering data in each of the building model, the hierarchical structure of building model data, and the COBie spreadsheet in response to receiving an interactive input action from the client computing device, the interactive input action indicating input device interaction with one of the building model, the hierarchical structure of building model data, and the COBie spreadsheet. In this way, data in data structures in each of the building model, the hierarchical structure of building model data, and the COBie spreadsheet can be interactively linked to quickly provide visual cues of the linked data. Additionally, linking data in this way for display enables greater consistency between the data to be provided.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments. As such, many modifications and variations will be apparent to practitioners skilled in the art. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

DETAILED DESCRIPTION

Aspects of this disclosure will now be described by example and with reference to the illustrated embodiments. Components and other elements that may be substantially the same in one or more embodiments are identified coordinately and are described with minimal repetition. It will be noted, however, that elements identified coordinately may also differ to some degree. It will be further noted that the drawings included herein are schematic and generally not drawn to scale. Rather, the various drawing scales, aspect ratios, and numbers of components shown in the figures may be purposely distorted to make certain features or relationships easier to see. Therefore, the figures are not intended to be technically precise, but are drawn to ease understanding.

A method which enables generation of a network accessible graphical user interface (GUI) simultaneously displaying a 3-dimensional rendering of a building model, a hierarchical structure of building model data, and a Construction Operations Building Information Exchange (COBie) spreadsheet is described herein. The simultaneous presentation of the aforementioned building data enables a user to quickly view pertinent information in separate data structures. As a result, user interaction with the data and user productivity is improved. Furthermore, the processing efficiency of the system is increased when the building model, a hierarchical structure of building model data, and COBie spreadsheet are simultaneously presented in a GUI when compared to previous systems which separately execute these data structures at different time intervals.

Figure 1:
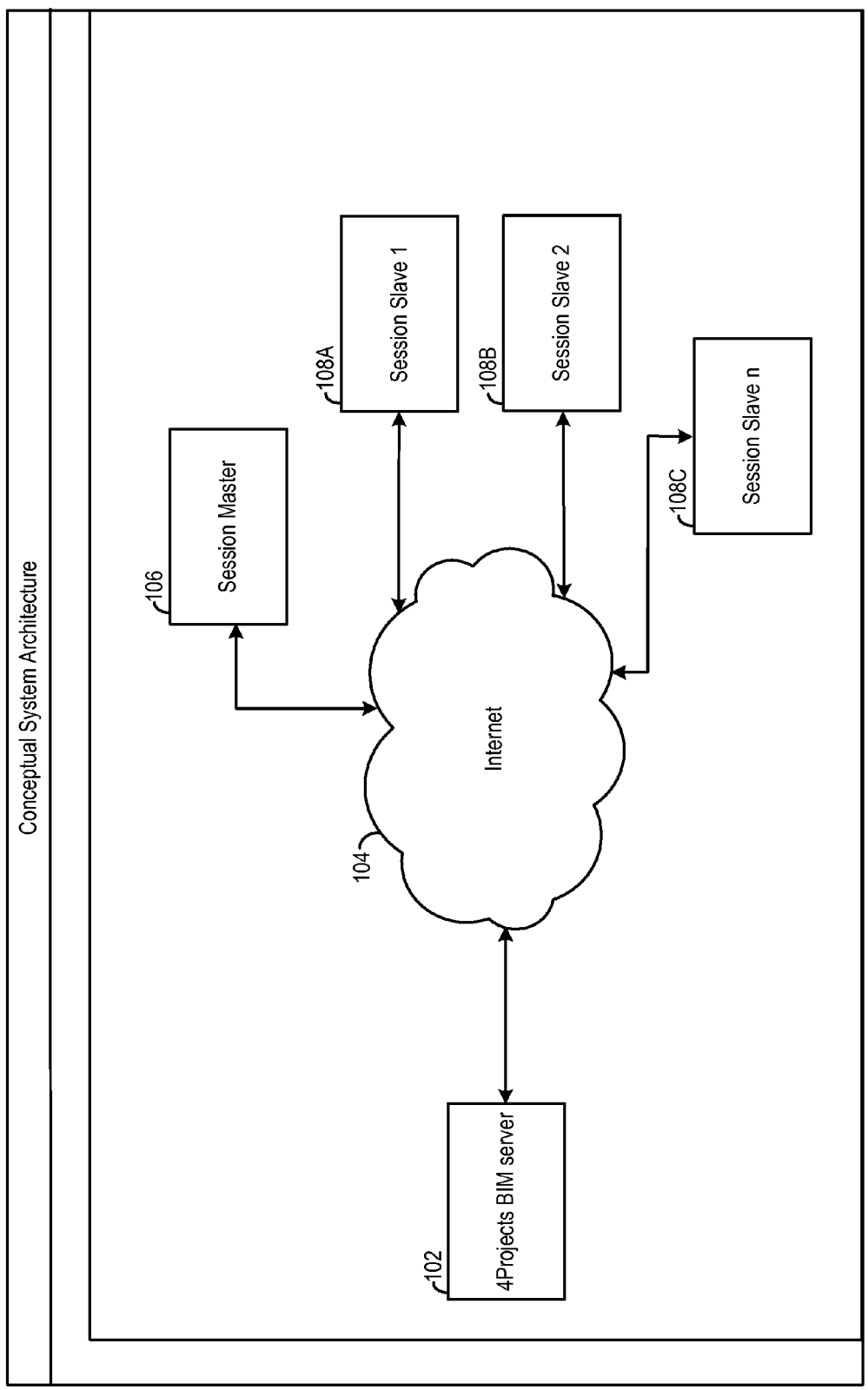
FIG. 1 shows a schematic drawing of a set of computing devices configured to process BIM-based data.

FIG. 1 shows a server computing device 102 connected via a network 104 to a session master computing device 106 and a set of session slave computing devices 108A-108C. Each computing device may include a processor and memory, but it will be understood that the functions performed and the data used could be distributed over a plurality of computing devices and/or storage devices, including a cloud computing arrangement. In practice, the session master and the session slave devices may be similar in terms of hardware and it is the functions performed by the device's user that determine whether they are master or slave devices in the system. However, it will be appreciated that the specific configuration (e.g., hardware, software, etc.,) of the computing device may vary between devices, in some examples.

At least the master 106 and slave 108 computing devices will have, or be associated with, a display device and user interface device (e.g., keyboard, mouse or graphics tablet, etc.) These components will be well known to the person skilled in the art and are not illustrated or described herein in detail. The communications between the various devices may be via any suitable wired or wireless communication structure (e.g., network). The example shows three slave devices, but it will be understood that any reasonable number (e.g., from one upwards) could be included.

The server device 102 executes code on its processor that allows it to process building information modeling (BIM)-based data in various ways, such as creating, displaying and/or editing models (e.g., via routines such as those included in the 4BIM package mentioned above) and also transfer related data to and from the master 106 and slave 108 devices over the network 104. It will be understood that "BIM-based data" can include building-related information according to any version and/or format of BIM. The data may be stored using any suitable data structure or arrangement and in some cases may be compressed and/or encrypted for storage and/or transmission.

Figure 4:
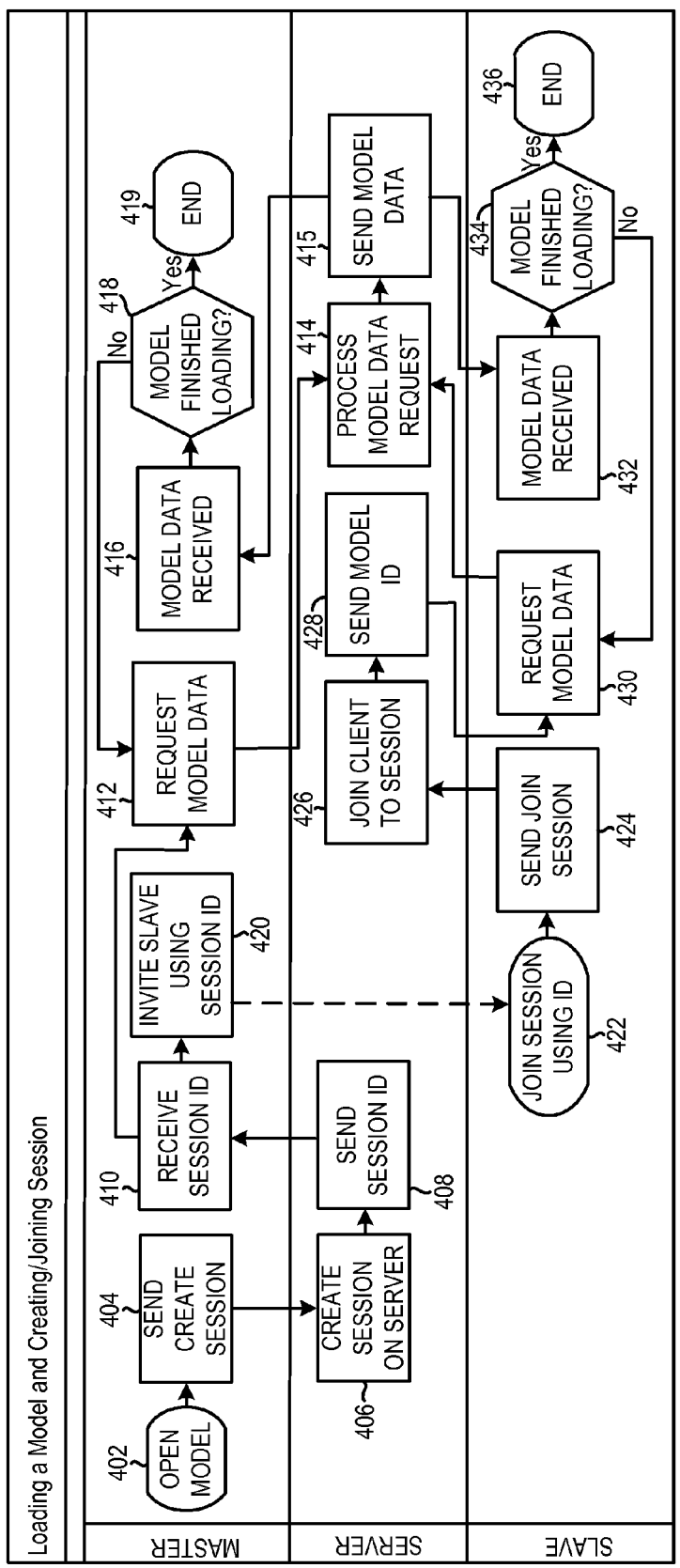
FIG. 4 shows a flowchart showing example steps involved in setting up a session for sharing BIM-based data.

In use, the code stored in memory executed via a processor on the server device 102 can perform steps including loading a model represented by BIM-based data and allowing users of the master 106 and the slave 108 devices to create and/or join a session relating to the model as illustrated in FIG. 4. It will be appreciated that code stored in memory executable by a processor can also perform the other methods described herein. It will be understood that the code and data can be implemented using any suitable programming language(s) and data structures. It will be appreciated that the steps shown in all of the flowcharts herein are exemplary only, and that in alternative embodiments some of them could be omitted, re-ordered or performed concurrently. Additional steps could also be included.

The example implementation detailed herein is based on the server device 102 controlling communication between the other devices (106 and 108). However, it will be understood that in alternative embodiments, at least some of the functions performed by the server device could be performed by one or more of the master/slave devices (e.g., a user could effectively directly use an application running on a master device to exchange data with the slave device(s) without the need for a server).

Figure 2:
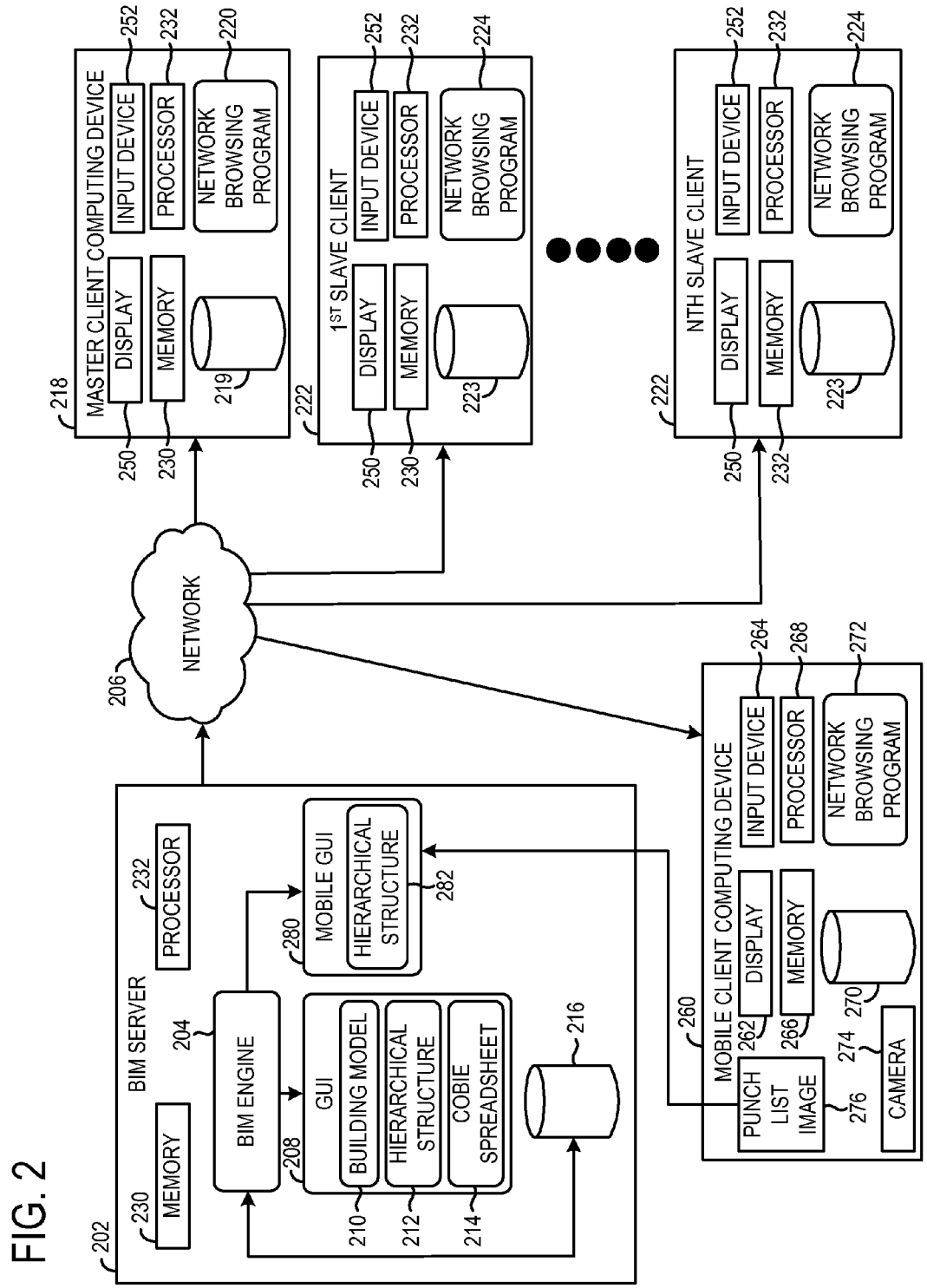
FIG. 2 shows a schematic depiction of a BIM system including a BIM server, master client computing device, and a plurality of slave client computing devices.

FIG. 2 shows a BIM system 200. The BIM system 200 is configured to efficiently manage data with regard to building construction, building operations, and/or building repairs and maintenance. Thus, the BIM system 200 provides a single platform to manage building data over various stages in the building lifecycle. It will be appreciated that a building may encompass any man made structure or group of structures, such as a facility.

The BIM system 200 includes a BIM server 202. The BIM server 202 includes a network-based BIM engine 204. The network-based BIM engine 204 may be configured to manage BIM data and enable client computing devices to access the BIM data over a network 206. The network 206 may be the Internet, in one example. However, other suitable networks have been contemplated such as a local area network (LAN), a wide area network (WAN), a virtual private network (VPN), etc. Specifically, the network-based BIM engine 204 may be configured to generate a graphical user interface (GUI) 208 including each of a building model 210, a hierarchical structure of building model data 212, and a COBie spreadsheet 214.

The building model 210 may include a 3-dimensional representation of objects in the building model. The objects may include components, systems, and structures in the building. The systems may include heating systems, plumbing systems, cooling systems, and/or electrical systems. Additionally, the structures include one or more of a door, a room, and/or a wall.

Additionally, the hierarchical structure of building model data 212 may be a directory structure such as a tree structure including graphical representations of sections, floors, systems, etc., and sub-directories of the sections, floors, systems such as rooms, components, structures, parts, etc., in one example. In this way, a user may easily view the conceptual arrangement of various features of the building.

Furthermore, the COBie spreadsheet 214 may include at least one or more of an equipment list, a product data sheet, a warranty, a spare parts list, and/or a preventative maintenance schedule in a COBie format. It will be appreciated that the COBie spreadsheet may include non-geometric data associated with various components, structures, etc., in the building model.

Additionally, it will be appreciated that COBie is an internationally recognized data exchange standard. COBie data includes building systems information between design and construction. COBie may be in different formats, such as an Excel format and/or an Excel spreadsheet format. In one example, the COBie data may be limited to a predetermined number of rows, such as a maximum of 65,536 rows. Additionally, the COBie data may also be COBieLite data in an extensible markup language (XML) format. COBie enables data relevant to building systems management to be quickly transferred to owner/operators of the building after the building is designed and constructed. Exemplary COBie data may include floor space, occupancy level, operation costs, maintenance schedule, energy use estimates, etc. It will be appreciated that COBie data may have a plethora of additional uses such as capturing survey information, documentation of maintenance issues, coordinating maintenance records, etc.

The COBie data can be color coded. Specifically, columns in the COBie data may be color coded in yellow, orange, purple, and green. The yellow color coding indicates a required data such a key, date, building information, etc. The orange color coding indicates reference and/or lookup data, such as a picklist, user, etc. The purple color coding indicates data that is automatically inserted by the system. Additionally, the green color coding indicates data that may be required if specified by the consumer or contract, for example. In this way, the COBie spreadsheet can be color coded according to a predetermined standard.

Additionally, the building model 210, the hierarchical structure of building model data 212, and the COBie spreadsheet 214 may be associatively liked via common identification data such as a common identification number.

The BIM engine 204 may be configured to validate one or more cells in the COBie spreadsheet 214. Specifically, the BIM engine 204 may be configured to compare COBie data in the COBie spreadsheet 214 stored in a database 216 with predetermined validation requirements. Additionally, in one example the validation may be implemented in real-time. It will be appreciated that versions of the building model 210 and/or hierarchical structure of building model data 212 may also be stored in the database 204.

A master client computing device 218 is also included in the BIM system 200. It will be appreciated that the master client computing device 218 may more generally be a client computing device in electronic communication with the BIM server 202 via the network 206. Additionally, the master client computing device 218 may be configured to access the GUI generated by the BIM engine 204. A network browsing program 220, such as a web-browser, may be used to access the GUI generated by the BIM engine 204, in one example. Additionally, the master client computing device 218 is configured to control the BIM engine 204. For instance, the master client computing device 218 is configured to input, delete, overwrite, etc., data in the building model 210, the hierarchical structure of building model data 212, and/or the COBie spreadsheet 214. In this way, the master client computing device 218 can remotely control the BIM engine 204 via the network connection. As a result, a user may access the BIM engine from a variety of remote locations, if desired.

The master client computing device 218 is also configured to send a save data command to the BIM engine 204. The save data command is configured to request associative mapping between identification data in each of the building model 210, a hierarchical structure of building model data 212, and the COBie spreadsheet 214. Additionally, a representation of the associatively mapped data may be stored in either the BIM server 202 and/or the master client computing device 218. The representation of the associatively mapped data may include viewing coordinates and/or vectors as well as a common identification number. Additionally, the representation of the associatively mapped data may not include graphical building data, in one example. Furthermore, the master client computing device 218 may include a database 219.

A plurality of slave client computing devices 222 are also included in the BIM system 200. Each of the slave client computing devices 222 is configured to passively access the BIM engine 204. Therefore in one example, the slave client computing devices 222 may be inhibited from controlling the BIM engine 204. The slave client computing devices 222 may be configured to view a session with the BIM engine 204 controlled via the master client computing device 218. Specifically, network browsing programs 224 included in each of the slave client computing devices 222 may be configured to facilitate passive access to the BIM engine 204. In this way, a plurality of computing devices may access the BIM engine 204 enabling a meeting with remotely located participants to be implemented, if desired. Specifically, the slave client computing devices 222 may passively view the GUI 208. Additionally, the slave client computing device 222 may include databases 223.

The BIM server 202, master client computing device 218, and the slave client computing devices 222 each include memory 230 holding instructions executable by a processor 232. Therefore, it will be appreciated that the methods and other functionalities described herein with regard to the BIM server and client computing devices may be stored in memory executable by a processor. Moreover, it will be appreciated that the memory and the processor in each of the aforementioned devices may not be equivalent, in one example. Additionally, each of the master client computing device 218 and the slave client computing devices 222 includes a display 250 and an input device 252. The displays 250 are configured to present visual information and the input devices 252 are configured to provide data and control signals to the device in response to user input. Example displays include liquid crystal displays (LCDs), touch displays, OLED displays, etc. Example input devices include keyboards, trackpads, mice, touch interfaces, etc. It will be appreciated that the types of displays and/or input devices may vary between computing devices, in one example.

The BIM system 200 further includes a mobile client computing device 260 having a display 262, input device 264, memory 266, processing 268, database 270, and network browsing program 272. The mobile client computing device 270 also includes a camera 274 configured to generate a punch list image 276. Additionally, the BIM server 202 may include a mobile GUI 280 including a hierarchical structure 282 of building model data. The hierarchical structure 282 may include at least a portion of the object and other data included in the hierarchical structure 212. However, in other examples the hierarchical structure 282 may be substantially identical to hierarchical structure 212. The BIM server 202 may be configured to provide access to the mobile GUI 280 via a plurality of mobile devices. Specifically, the mobile client computing device 270 is configured to access the mobile GUI 280 over the network 206. It will be appreciated that the mobile GUI 280 provides access of a portion of the data in the GUI 208 to mobile devices which may not have the network connectivity speeds and/or processing power to quickly access and control the GUI 208. Additionally, the punch list image 276 may be an image of an object, structure, component, system, etc., in a building. The punch list image 276 may be associated with an object in the hierarchical structure 282. The mobile client computing device 260 is configured to send the punch list image 276 to the BIM server 202 and specifically the BIM engine 204. Subsequently, the BIM engine 204 associates the punch list image with data in one or more of the building model 210, hierarchal structure 212, and the COBie spreadsheet 214. Specifically, the punch list image may be linked to data in the building model 210, hierarchal structure 212, and/or the COBie spreadsheet 214. In one example, a barcode or QR code can be generated for an individual item's Globally Unique Identifier (GUID) in a model. Users can then print the barcode or QR code and physically affix it to an item in the building. When the user has an issue with the item they can use their mobile phone/tablet's camera to scan the barcode or QR code which identifies the item in the model they are trying to access.

In this way, a user of the mobile computing device can take a picture (i.e., a punch list image) of an object in the hierarchical structure and then send it to the BIM engine. As a result, a user can generate an image on the fly via a mobile device which can be subsequently associated with the building model, hierarchical structure, and the COBie spreadsheet executed via the BIM engine 204.

Figure 3:
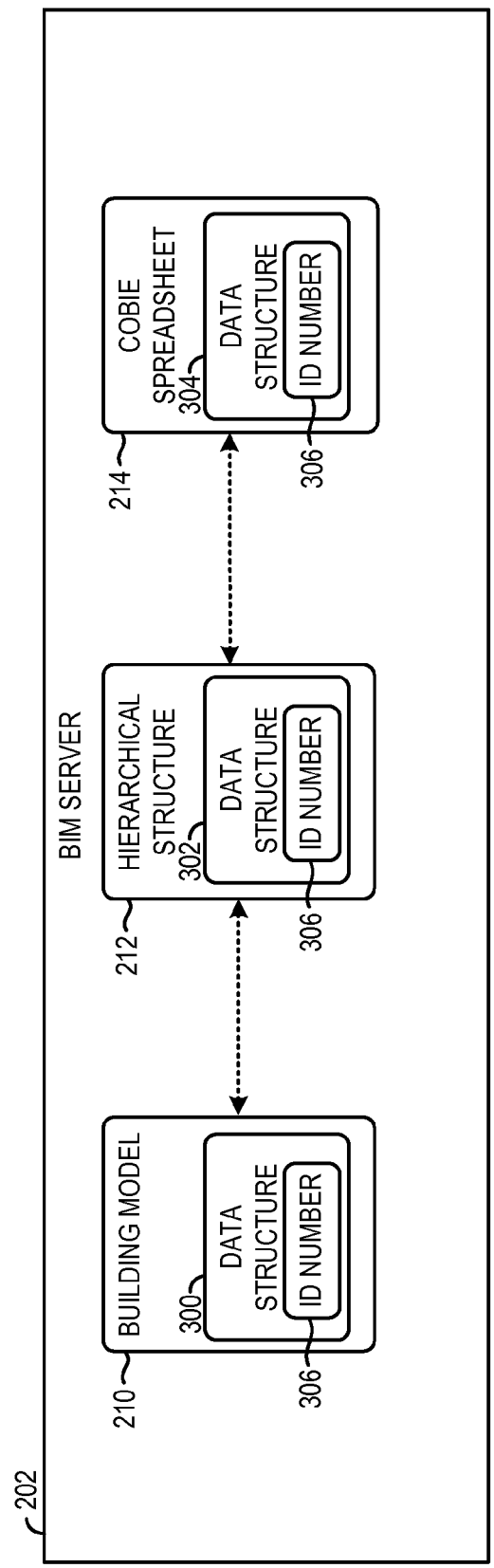
FIG. 3 shows a detailed view of a portion of the BIM server shown in FIG. 2.

FIG. 3 shows an example of how data is linked in the BIM server 202. Again, the building model 210, hierarchical structure 212, and COBie spreadsheet 214 are shown. Each of the building model 210, hierarchical structure 212, and COBie spreadsheet 214 includes data structures 300, 302, and 304, respectively. These data structures each include a common identification number 306. In this way, the building model, the hierarchical structure of building model data, and the COBie spreadsheet are associatively linked via a common identification number. Additionally or alternatively, in other examples other types of identification data may be used such as a bar codes, QR codes, etc. The common identification number enables these 3 separate data structures to be linked for retrieval and viewing. In one example, the COBie spreadsheet and the hierarchical structure are generated from a source file (e.g., a source Industry Foundation Classes (IFC) file) and when generating the COBie spreadsheet and the hierarchical structure the spreadsheet and structure may be appended with a Globally Unique Identifier (GUID). In this way, identifiers can be used to link the hierarchical structure and COBie spreadsheet. It will be appreciated that the building model can be linked to the other data structures in this same way. It will be appreciated that a GUID can be queried in the databases to find all the links to the specified GUID.

At step 402 of FIG. 4, a user of the master device 106, shown in FIG. 1 opens a model (e.g., by creating a new model or loading BIM-based data from an existing file). This can typically involve connecting to the server device 102 via a world wide web (WWW) browser running on the master device and accessing a webpage/application that interacts with the code executing on the server device. This may involve the user providing a user identifier and password and then selecting a "create/load new model" option or the like. After this, at step 404, the master device sends a message to the server device indicating that a new session is to be created. At step 406 the server device creates the new session and at step 408 the server device transfers an identifier for the session, which is received by the master device at step 410.

After the session identifier has been received, at step 412 the master device 106 requests the model data as currently stored by the server device 102 and at step 414 this request is received by the server device. At step 415, the server device transfers the model data and it is received by the master device at step 416. At step 418, the master device checks whether all the model data has been received/finished loading; if not then the method returns to step 412 to continue transfer of the model data. When the model data has finished loading then the process of the master device creating the session can end at step 419.

If the user of the master device 106 wants to invite one of the slave devices 108 (e.g., device 108A) to join the session so that the user of that slave device can collaborate in relation to the model then at step 420 the master device user selects an appropriate option on the web page/application for sending an invitation to the slave device. At step 422, the invitation is received at the slave device, which is also in communication with the server device 102 web page/application (e.g., after logging in by providing a username and password). The invitation includes the session identifier and at step 424 the user of the slave device can accept the invitation and a message is sent to the server device (received at step 426) indicating that the slave device is joining the session as a client. This results in the identifier of the model accessed by the master device being retrieved and at step 428 the identifier is sent to the slave device. At step 430 the slave device requests the model data corresponding to the identifier from the server device. The server device then performs steps 414 and 415 as described above, but in relation to the slave device rather than the master device, with the slave device receiving the model data at step 432. At step 434, the slave device checks whether all the model data has been received/finished loading; if not then the method returns to step 430 to continue transfer of the model data. When the model data has finished loading then the process of the slave device joining the session can end at step 436. In one example, the slave devices may only receive model data that is relevant to the current session at the point of joining (i.e., matching the master client).

Figure 5:
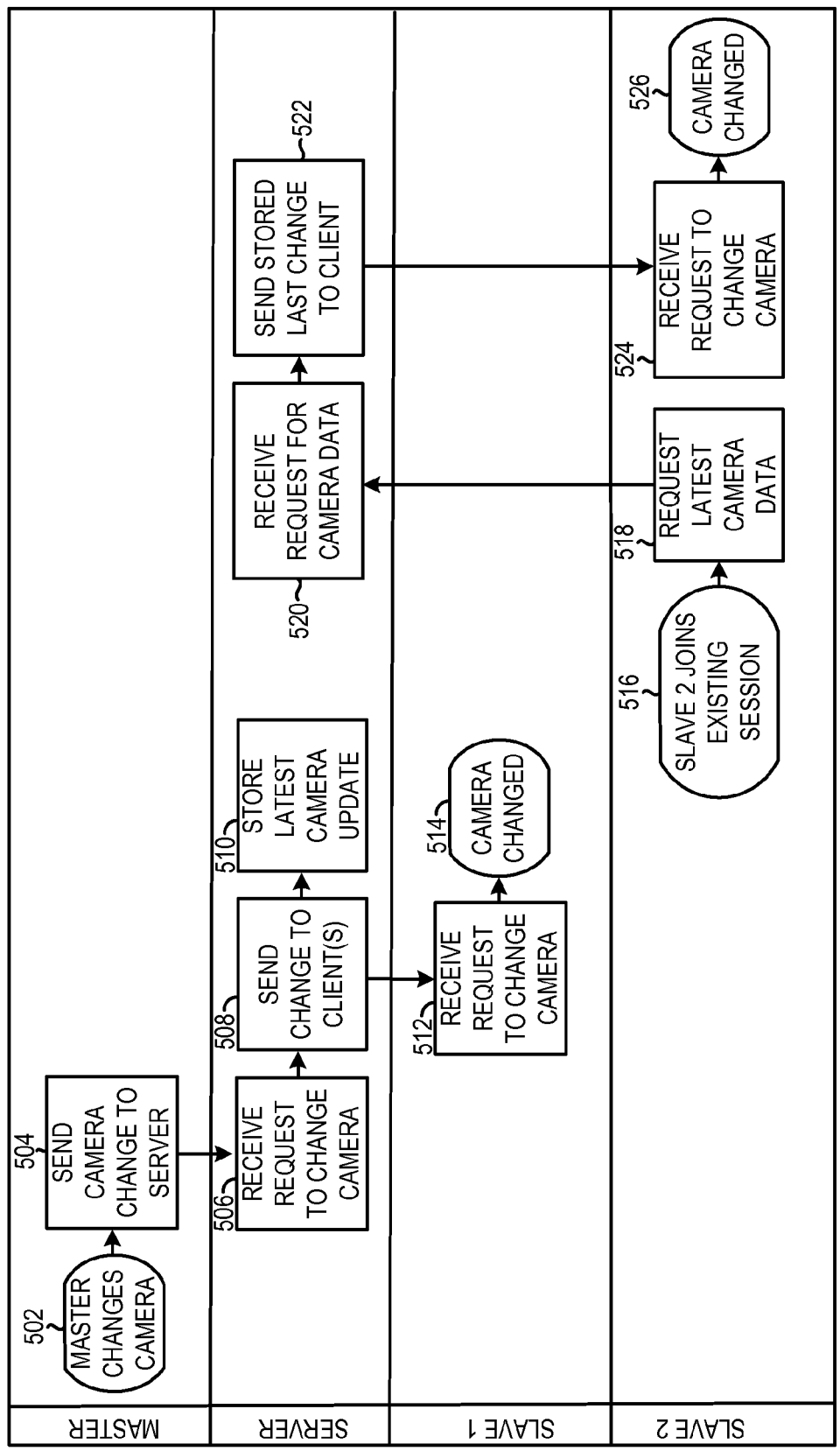
FIG. 5 shows a flowchart showing example steps involved in updating displays of the computing devices during the session.

FIG. 5 shows example steps involved in updating data on slave devices 108, shown in FIG. 1, based on actions performed on the master device 106 in relation to processing/updating the BIM-based model data. The illustrated example relates to the viewing/camera angle being updated by the user of the master device. However, it will be understood that corresponding steps can be performed in relation to any other data updating/processing performed on the master device, such as changing the on-screen visibility of certain model features (e.g., making walls, floors or doors invisible, etc.,) which property/tree tab are open, selection of item(s) of the model, adding comments or chat messages, etc. At step 502 of FIG. 5, the user of the master device 106 updates the model data in some way. In the example, the camera viewing angle is changed. At step 504, data relating to the update is transferred from the master device and at step 506 this is received by the server device 102. At step 508, the server device sends data relating to the update to the slave device(s) that are party to the session. This comprises the slave device 108A in the example, but it could comprise a plurality of the slave devices if more than one has joined the session. The server device also stores the updated model data at step 510. At step 512 the data transferred at step 508 is received by the slave device 108A and at step 514 the display associated with the slave device is updated to reflect the updated camera angle.

FIG. 5 also demonstrates an additional slave device joining an on-going session (e.g., the user of another slave device (e.g., device 108B)), is invited to join the session in a similar manner to steps 420 onwards, of FIG. 4. At step 516, the slave device 108B joins the session and as part of this process, it receives the model data. At step 518 the slave device requests data relating to the latest update performed on the model data in order to ensure that the data it has is up-to-date. At step 520 this request is received by the server device 102, which arranges to send the data related to the last change/update made to the model by the master device. At step 524, this update data is received by the slave device 108B and at step 526 the display associated with the slave device is updated. Thus, using the camera data transferred, the slave device can adjust the camera position to exactly match the viewpoint as set by the master device.

Embodiments of the methods described herein have "domain knowledge" about the type of BIM-based model that is the subject of the sessions and leverage this to reduce (e.g., minimize) the data transferred over the network between the various devices. The detailed example given above relates to the 3D camera used to display the BIM-based model. The 3D Camera can be represented in various ways, such as a 4×4 transformation matrix (e.g., 16 floating point values), or 3 floating point vector/angles. By sending this data, in some cases in combination with other information (e.g., session identifier, etc.), rather than an image/bitmap of what the camera sees. This data management method can significantly reduce the amount of data transferred to the computing devices from the server.

In addition to the improved performance resulting from reduced volume of data transfer, there are also other benefits associated with embodiments of the methods described herein. For instance, if the display devices associated with the master and slave devices have different aspect ratios (e.g., a 4:3 monitor and a widescreen monitor) then the method can match monitor size and aspect ratio, whilst the user of the slave device will be looking at the same central point without their own view having to be resized to fit the master device's viewpoint, which can result in an improved user experience.

Figure 6:
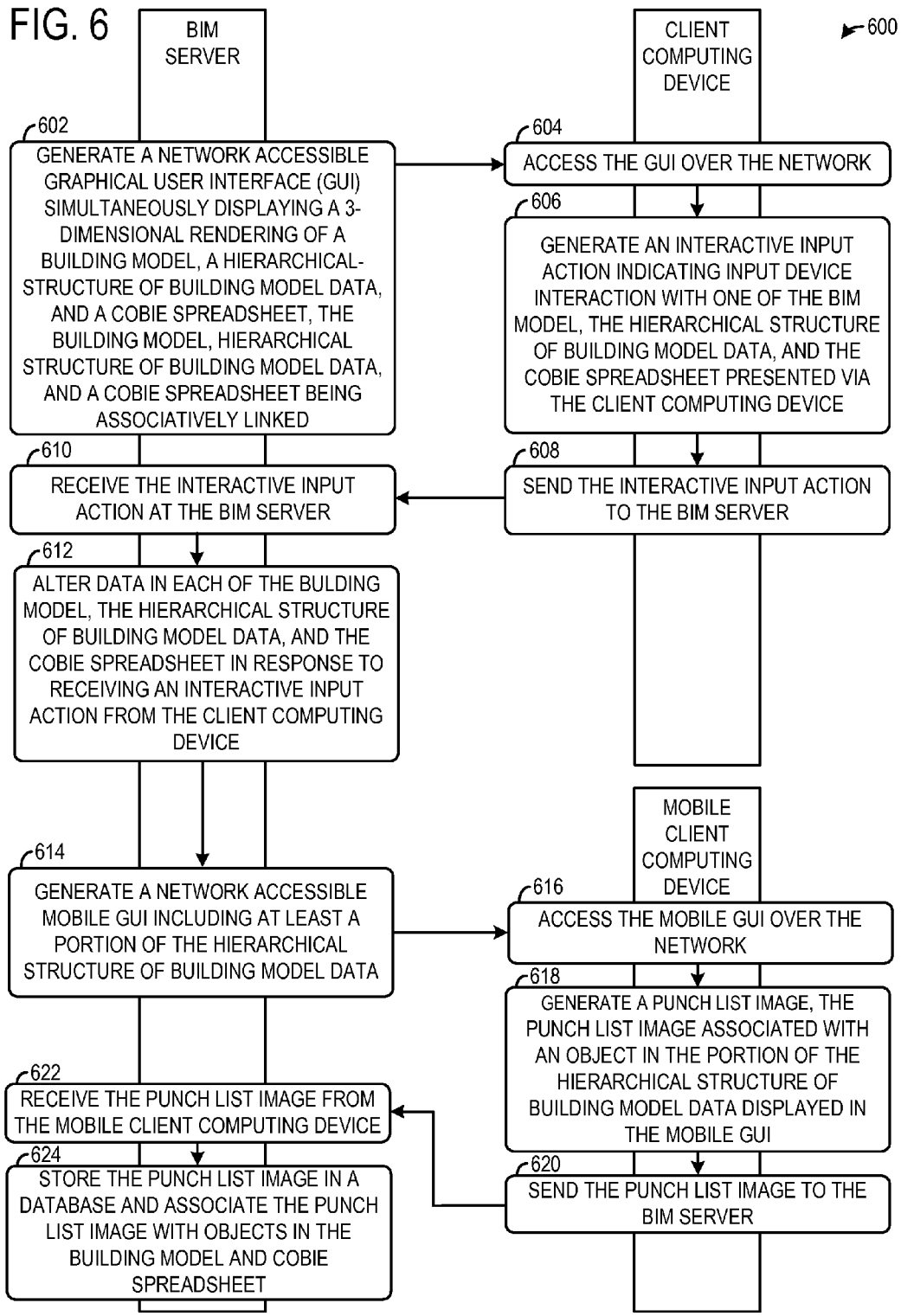
FIGS. 6-7 show various methods for operating BIM systems.

FIG. 6 shows a method 600 for operating a BIM system. The BIM system may be the BIM system 200 discussed above with regard to FIG. 2, in one example. However, in another example another suitable BIM system may be used to implement the method 600.

At 602 the method includes at a BIM server, generating a network accessible graphical user interface (GUI) simultaneously displaying a 3-dimensional rendering of a building model, a hierarchical structure of building model data, and a COBie spreadsheet. Next at 604 the method includes, at a client computing device, accessing the GUI over the network. As previously discussed the network may be the Internet. Therefore, it will be appreciated that the client computing device accesses the GUI to enable simultaneously viewing of the 3-dimensional rendering of the building model, the hierarchical structure of building model data, and the COBie spreadsheet At 606 the method includes generating an interactive input action indicating input device interaction with one of the building model, the hierarchical structure of building model data, and the COBie spreadsheet presented via the client computing device. At 608 the method includes sending the interactive input action to the BIM server from the client computing device. At 610 the method includes receiving the interactive input action at the BIM server. At 612 the method includes at the BIM server altering data in each of the building model, the hierarchical structure of building model data, and the COBie spreadsheet in response to receiving an interactive input action from the client computing device. Altering the data in each of the building model, hierarchical structure, and COBie spreadsheet may include altering the associative mapping between data in each of the building model, hierarchical structure, and COBie spreadsheet.

For example, a user may select or otherwise manipulate an object in the building model via an input device corresponding to the client computing device. In response to the selection the objects name and/or icon may be displayed, highlighted, etc., in the hierarchical structure and COBie data corresponding to the object may be highlighted displayed in the COBie spreadsheet. In this way, a user is quickly provided with pertinent data pertaining to objects in the building model.

Further in one example, the COBie spreadsheet may include cells populated with COBie formatted data. Still further in another example, the COBie data includes at least one of an equipment list, a product data sheet, a warranty, a spare parts list, and/or a preventive maintenance schedule in COBie format. It will be appreciated that data in the COBie spreadsheet may be associated with building model data. In this way, numerous pieces of building management information may be tied together in single GUI, enabling a user easily view and/or manipulate a wide variety of building information. As a result, a wide variety of users (e.g., architects, engineers, contractors, maintenance personal) may utilize this platform, thereby increasing the platforms applicability and streamlining building information management.

Further in one example, the building model includes 3-dimensional representations of objects, the objects including components, systems, and structures of a building. In such an example, the systems may include one or more of a heating system, a plumbing system, a cooling system, and an electrical system. Still further in such an example, the structures may include one or more of doors, rooms, and walls. In another example, the COBie spreadsheet may include equipment lists, product data sheets, warranties, spare parts lists, and/or preventive maintenance schedules in COBie format.

At 614 the method includes at the BIM server generating a network accessible mobile GUI including at least a portion of the hierarchical structure of building model data. At 616 the method includes at a mobile client computing device accessing the mobile GUI over the network. The mobile client computing device may be a smart-phone, a tablet, etc.

The mobile client computing device may include a camera and input devices such as a key-pad, touch-screen, keyboard, buttons, etc.

Next at 618 the method includes, at the mobile client computing device, generating a punch list image, the punch list image associated with an object in the portion of the hierarchical structure of building model data displayed in the mobile GUI. At 620 the method includes, at the mobile client computing device, sending the punch list image to the BIM server. Next at 622 the method includes, at the BIM server, receiving the punch list image from the mobile client computing device. At 624 the method includes storing the punch list image in a database and associating the punch list image with objects in the building model and COBie spreadsheet. In this way, a user can quickly link a picture taken with a mobile device to tri-dimensional data in the building model, COBie spreadsheet, and hierarchical structure. Thus, images of a building, such as a building under construction, can be linked to building design, modeling, and maintenance data stored in the BIM server, providing a greater amount of information to people involved in building design, maintenance, etc.

Figure 7:
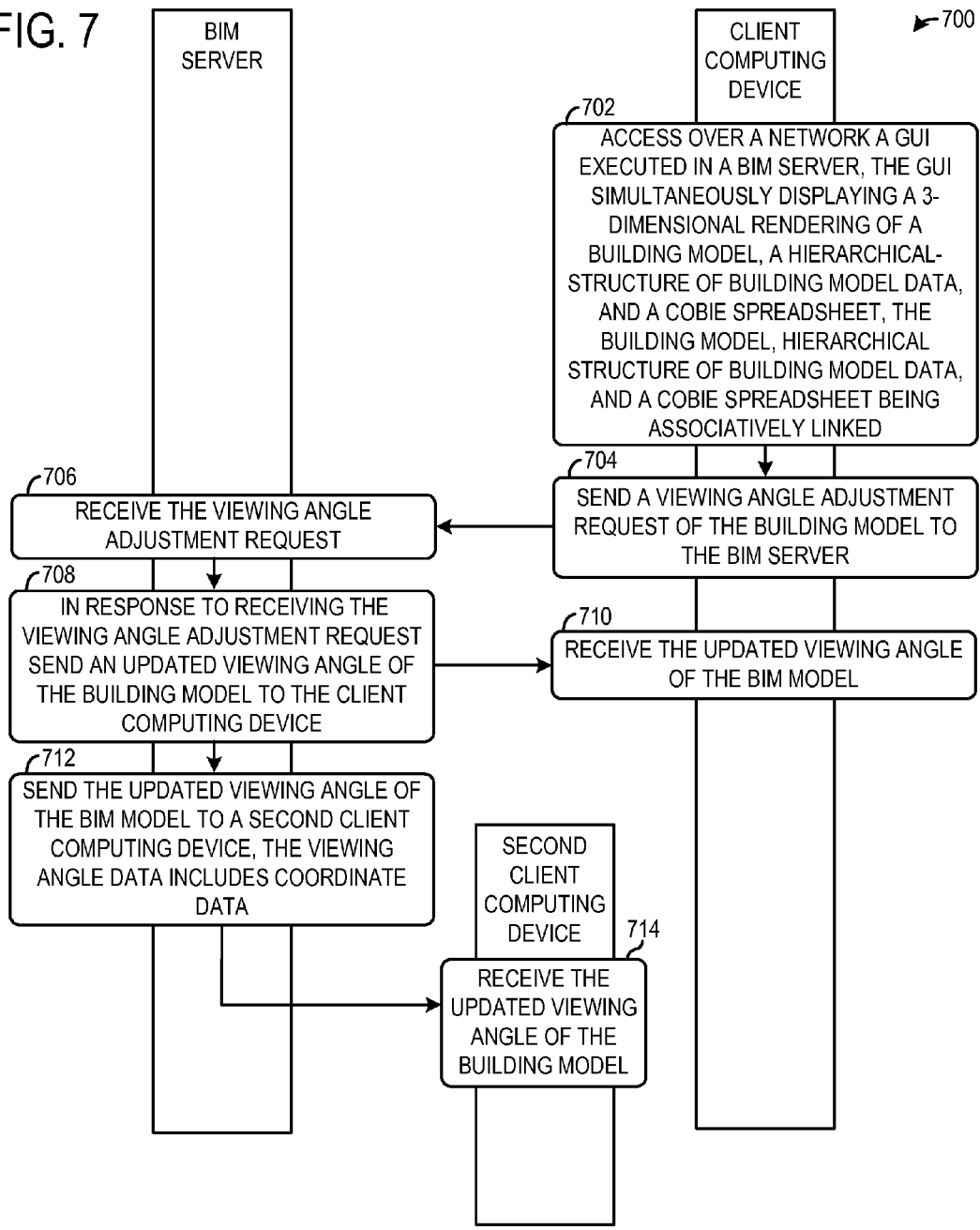

FIG. 7 shows a method 700 for operating a BIM system. The BIM system may be the BIM system 200 discussed above with regard to FIG. 2, in one example. However, in another example another suitable BIM system may be used to implement the method 700.

At 702 the method includes, at a client computing device, accessing over a network a graphical user interface (GUI) executed in a BIM server, the GUI simultaneously displaying a 3-dimensional rendering of a building model, a hierarchical structure of building model data, and a COBie spreadsheet, the building model, hierarchical structure of building model data, and a COBie spreadsheet being associatively linked. In one example, the client computing device may be a master client computing device permitted to alter data in each of the building model, the hierarchical structure of building model data, and the COBie spreadsheet. It will be appreciated that in one example method 700 may include steps 606-612 subsequent to step 702 and prior to step 704. In another example, the client computing device is a slave client computing device inhibited from altering data in each of the building model, the hierarchical structure of building model data, and the COBie spreadsheet. Still further in another example, the network is the Internet and the GUI is accessed via a web browsing program on the client computing device.

At 704 the method includes at the client computing device sending a viewing angle adjustment request of the building model to the BIM server. At 706 the method includes receiving the viewing angle adjustment request at the BIM server. Next at 708 the method includes, at the BIM server, in response to receiving the viewing angle adjustment request sending an updated viewing angle of the building model to the client computing device. At 710 the method includes at the client computing device receiving the updated viewing angle of the building model.

At 712 the method includes sending the updated viewing angle of the building model to a second client computing device, the viewing angle data includes coordinate data. At 714 the method includes, at the second client computing device receiving the updated viewing angle of the building model. In one example, the second client computing device may be a slave client computing device.

FIGS. 8-14 show various example GUI's which may be generated via the BIM engine 204 and accessed via the network browsing programs (220 and 224) included in the client computing devices (218 and 222), discussed above with regard to FIG. 2.

Figure 8:
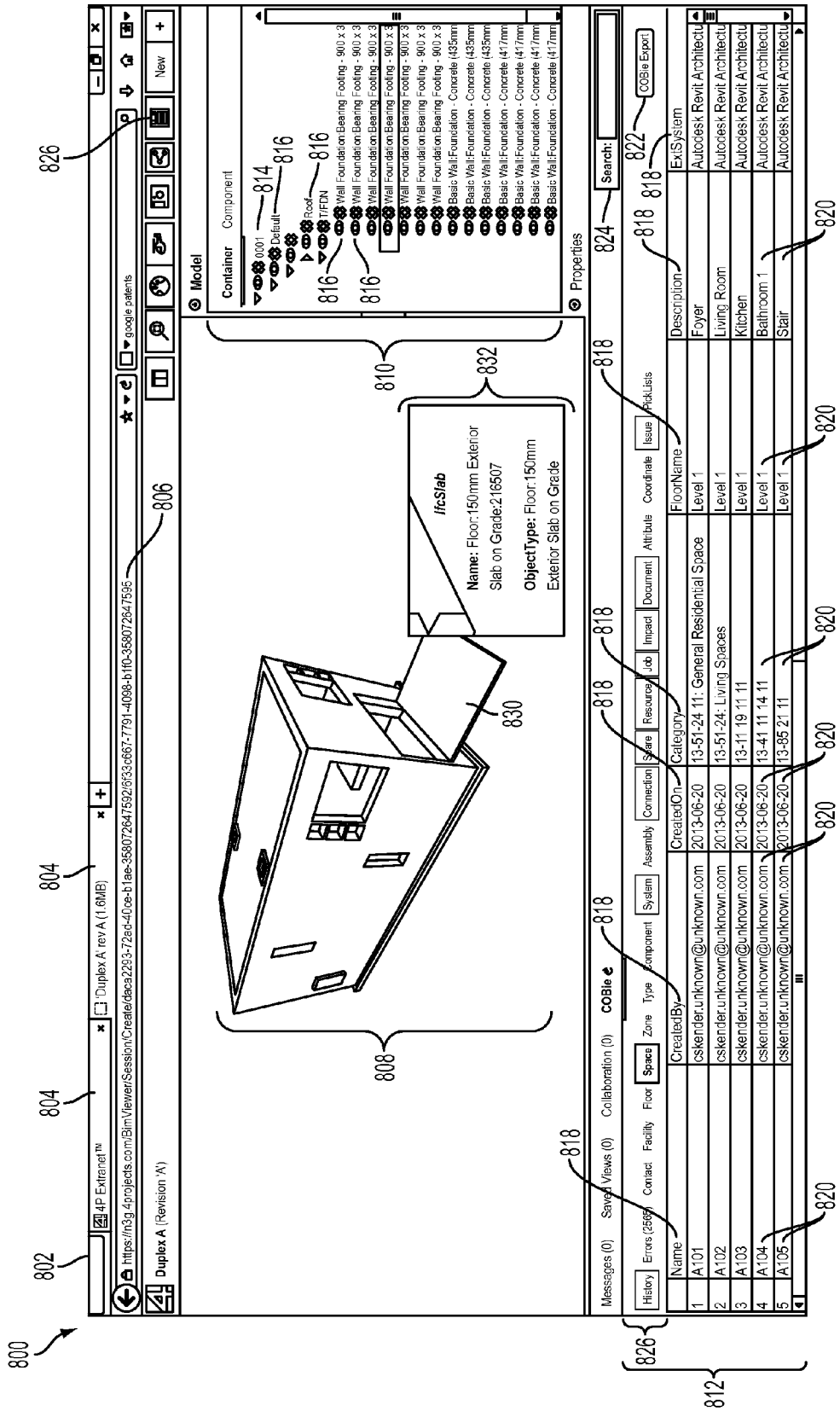
FIGS. 8-14 show example graphical user interfaces (GUIs) that may be generated and viewed in the BIM system shown in FIG. 2.

Specifically, FIG. 8 shows a GUI 800 included in a browser window 802. It will be appreciated that the browser window 802 may executed on a client computing device such as the master client computing device 218 and the slave client computing devices 222, shown in FIG. 2.

The browser window 802 may include tabs 804 and a network address field 806. The network address field 806 enables the browser to access the BIM engine 204, shown in FIG. 2, via the network 206, shown in FIG. 2. The GUI 800 includes a building model 808, a hierarchical structure of building model data 810, and a COBie spreadsheet 812. The building model 808 includes graphical representations of building objects, structures, etc., such as walls, windows, roofs, etc. Additionally, the hierarchical structure of building model data 810 includes directories 814 and sub-directories 816. The directories and sub-directories are related to objects in the building model. In this way, a user may easily disseminate how objects in the model are conceptually organized in a data structure. Each of the directories and sub-directories may include icons and alphanumeric symbols. Specifically, in one example the hierarchical structure of building model data 810 is a hierarchical tree structure with a root value and sub-trees of children, represented as a set of linked nodes. The directories may be the root value and the sub-trees of children may be the sub-directories.

The COBie spreadsheet 812 includes categories 818 and category fields 820. The category fields may be more generally referred to as cells. The cells may be populated by data entered via a user. The categories 818 may include an object name, a name of the creator of the object, a date of object creation, a floor name, a description of the object, and an associated external system. The category fields 820 include COBie formatted data. Additionally, the COBie spreadsheet may be color coded based on the type of data in the spreadsheet field. As previously discussed, the COBie data may be validated via a BIM engine. It will be appreciated that interaction with one of the building model 808, the hierarchical structure of building model data 810, and the COBie spreadsheet 812 may initiate changes in the other two features. In this way, information across these data sets may be linked. It will be appreciated that each of the aforementioned features are bounded in panels adjacent to one another, in the depicted example. Specified objects such as roofs, floors, stairs, and walls are arranged in a tree structure in the depicted example. Each of the objects may have a specific identification number.

Further in one example, clicking an object (e.g., structural item) in the 3-dimensional building model brings the structural item into view in the hierarchical structure and displays the objects COBie data in the COBie spreadsheet. Likewise, clicking the item on the hierarchical structure with display the item's COBie data on COBie spreadsheet and highlight the item in the 3-dimensional building model. A COBie export 822 button is also provided in the GUI 800 to enable COBie data to be exported to other computing devices, systems, etc. A search tool 824 is also provided in the GUI 800. Categories 826 such as history, errors, contact, facility, floor, space, zone, type, component, system, assembly, connection, spare, resource, job, impact, document, attribute, coordinate, issue, and/or PickLists are also provided in the GUI. A save button 828 may also be configured to generate a save command that may be sent to the BIM server to initiate storing of various data associated with each of the building model, the hierarchical structure, and the COBie spreadsheet, as previously discussed.

In one example, some objects in the building model 808 are made partially transparent to facilitate viewing of interior objects. Thus, an x-ray option that can be activated allowing a user to view interior structures of the building model through the walls. Further in one example, the GUI 800 may shows an interior view of the building model as witnessed by the 3-dimensional camera that is configured to move around the 3D image in a plurality of manners including an orbiting mode and a helicopter mode.

Additionally, the GUI 800 shows how hovering over an item or clicking an object 730 in the 3D viewer will display certain information 832 related to that item in the 3D viewer. Such information may include but not be limited to: item name, item dimensions, item serial number, color, creation date, and creator name.

Figure 9:
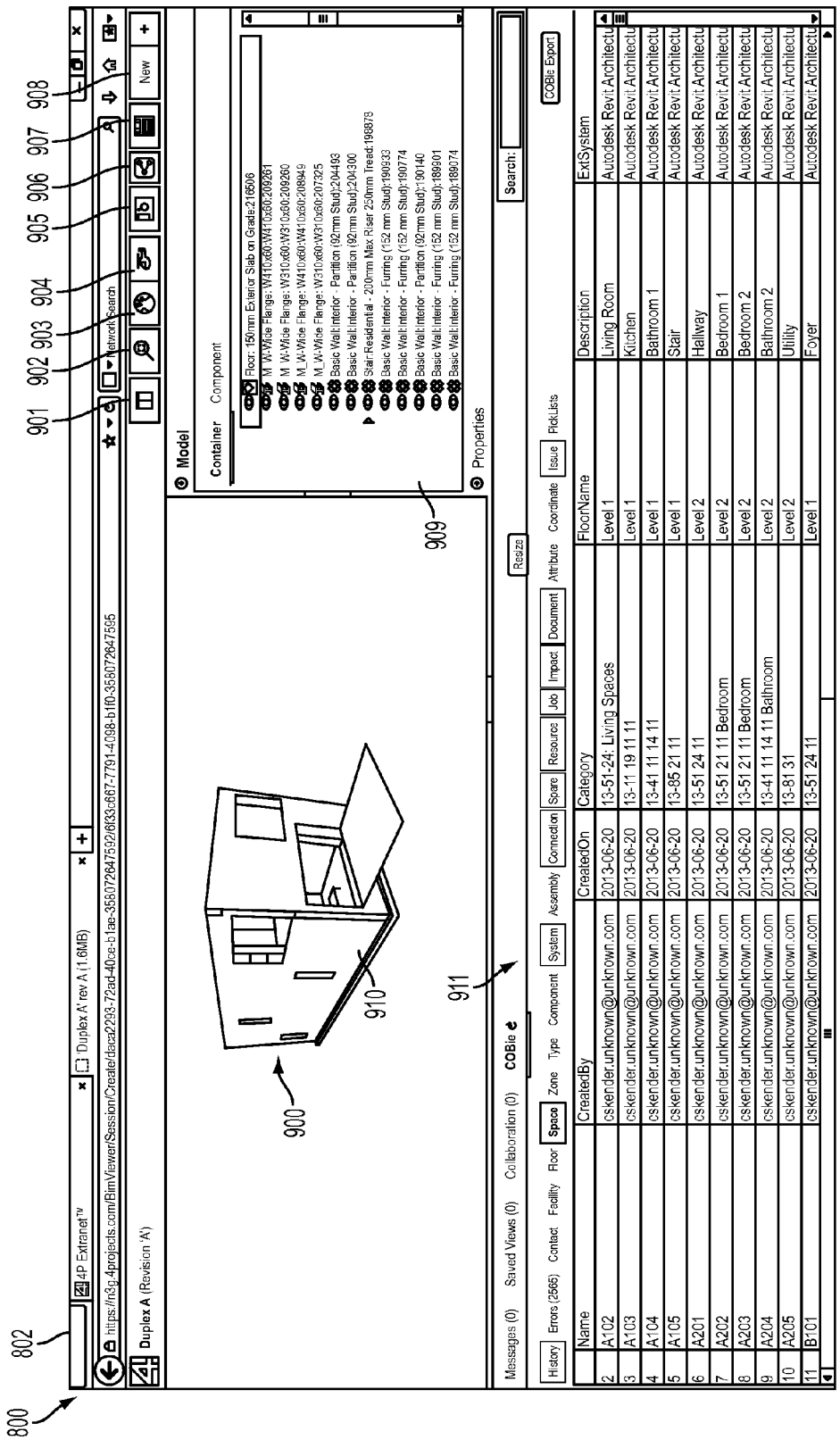

FIG. 9 shows another aspect of the GUI 800 included in the browser window 802. Specifically, FIG. 9 details optional tools within the interface for accessing the building model. 900 indicates a 3D viewer. 901 indicates an x-ray view button. 902 indicates a zoom tool. 903 indicates a camera orbiting mode button. 904 indicates a helicopter camera viewing button. 905 indicates a button that takes a screenshot. 906 indicates a button that creates a shared session between the current BIM viewer and another user. 907 indicates a button that saves a current view point in the building model so that a user can return to the viewpoint at a later time. This effectively stores the state of the viewer in terms of parameters like current camera position, visibility state, camera mode (e.g., orbit, helicopter, etc.) xray mode, etc. The button, indicated at 907, also take a thumbnail screenshot of the viewpoint so that the user can visualize the saved view, in one example. A button may also be provided in the GUI 800 which enables the user to save changes in the COBie data. In one example, the button enabling the saving of COBie data may be presented in response to a change in the COBie data. 908 indicates a button that allows the user to make a new task or discussion relating to the building model. Tasks and discussions may include but not be limited to titles, screenshots, dates, deadlines, folders, names of responsible individuals, location, and text editing features like highlighting and fonts. 909 indicates a hierarchical structure (e.g., item tree) for the structure of interest; items may be organized by type, floor, location, or other sub categories. 910 indicates the 3-D building model. 911 indicates the COBie spreadsheet panel containing COBie data related to the structure of interest.

Figure 10:
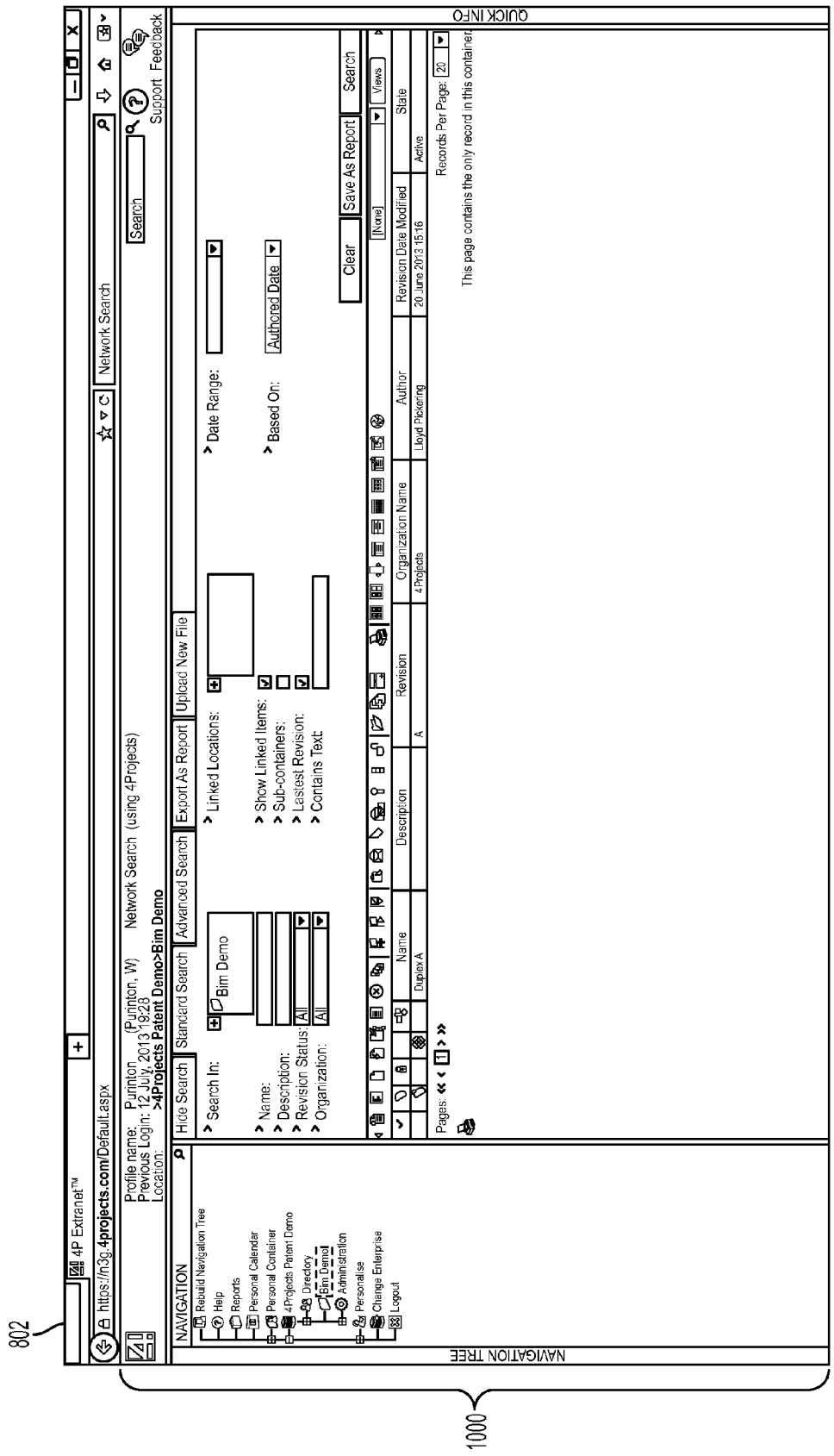

FIG. 10 is an example of an access page 1000 that allows a user to access the BIM viewer. The access page 1000 is presented in the browser window 802. A user can log into the web site with a username and password to verify that they are authorized to have access to certain BIM information and content. In this way, the building model, COBie spreadsheet, and hierarchical structure can be accessed online. This allows one user to manage multiple projects and schedules related to those projects. Additionally, fields are provided in the access page 900 to enable a user to select various stages of project revisions as well as link items in the project to other files.

Figure 11:
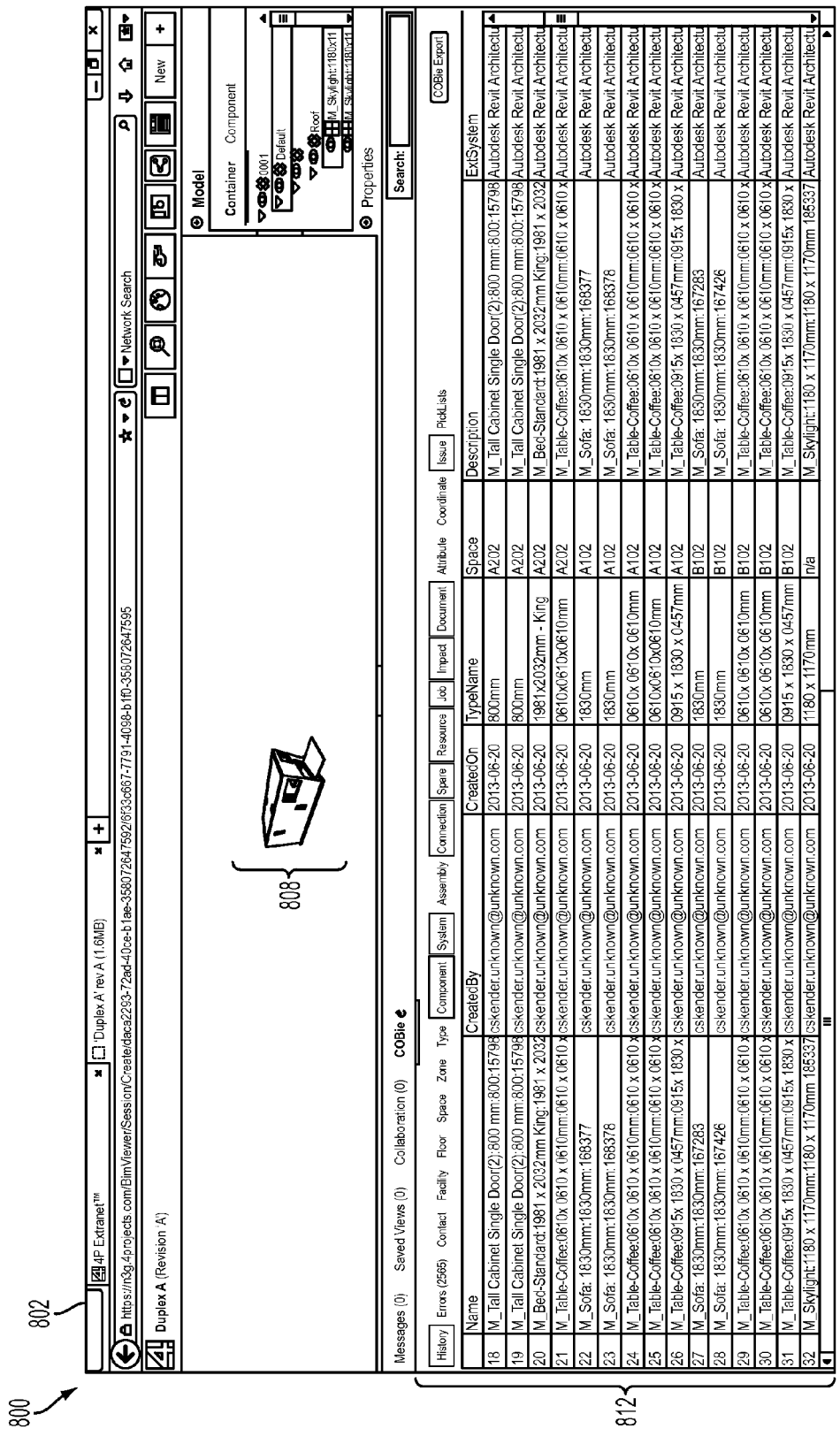
Figure 12:
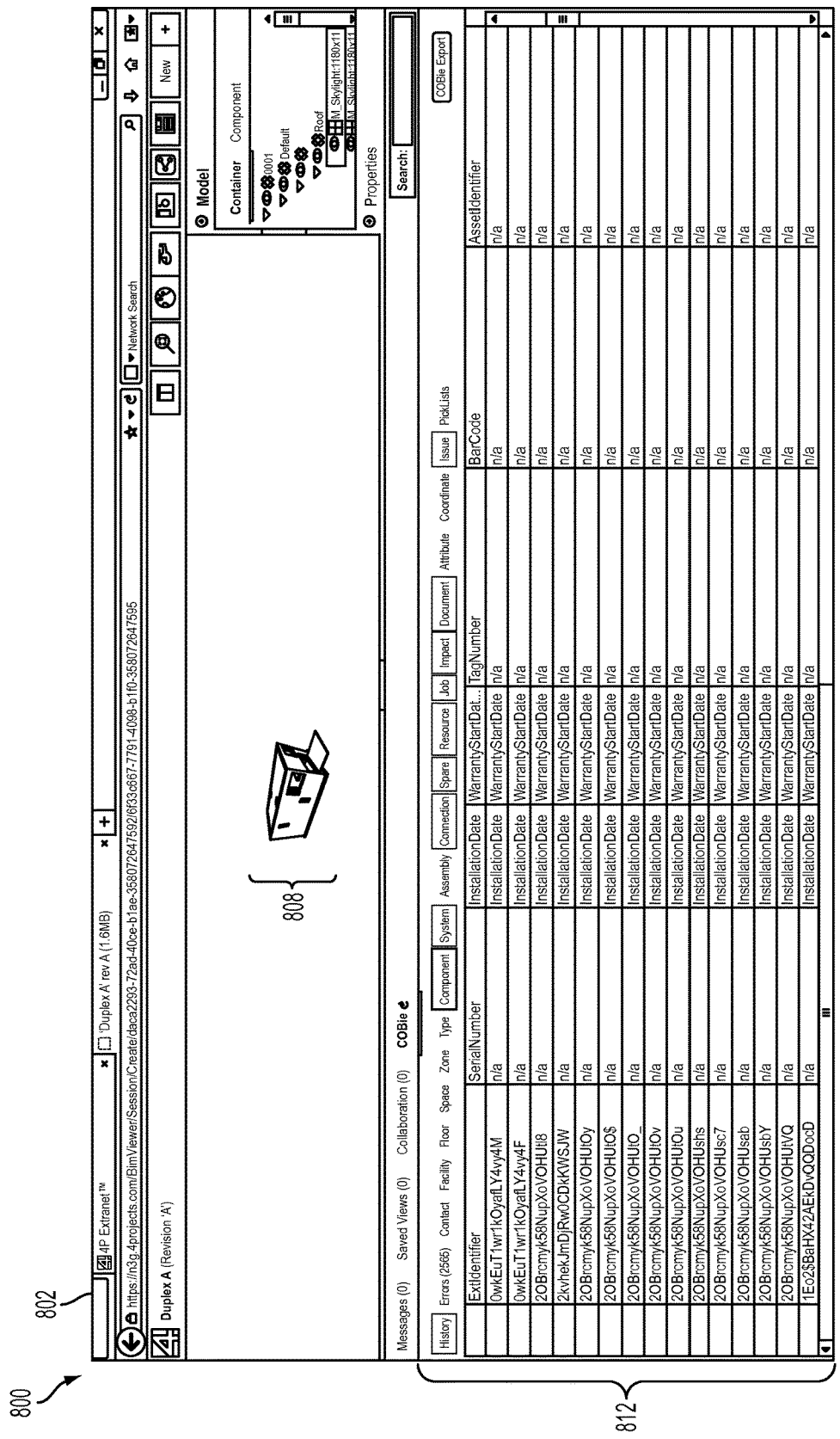
Figure 13:
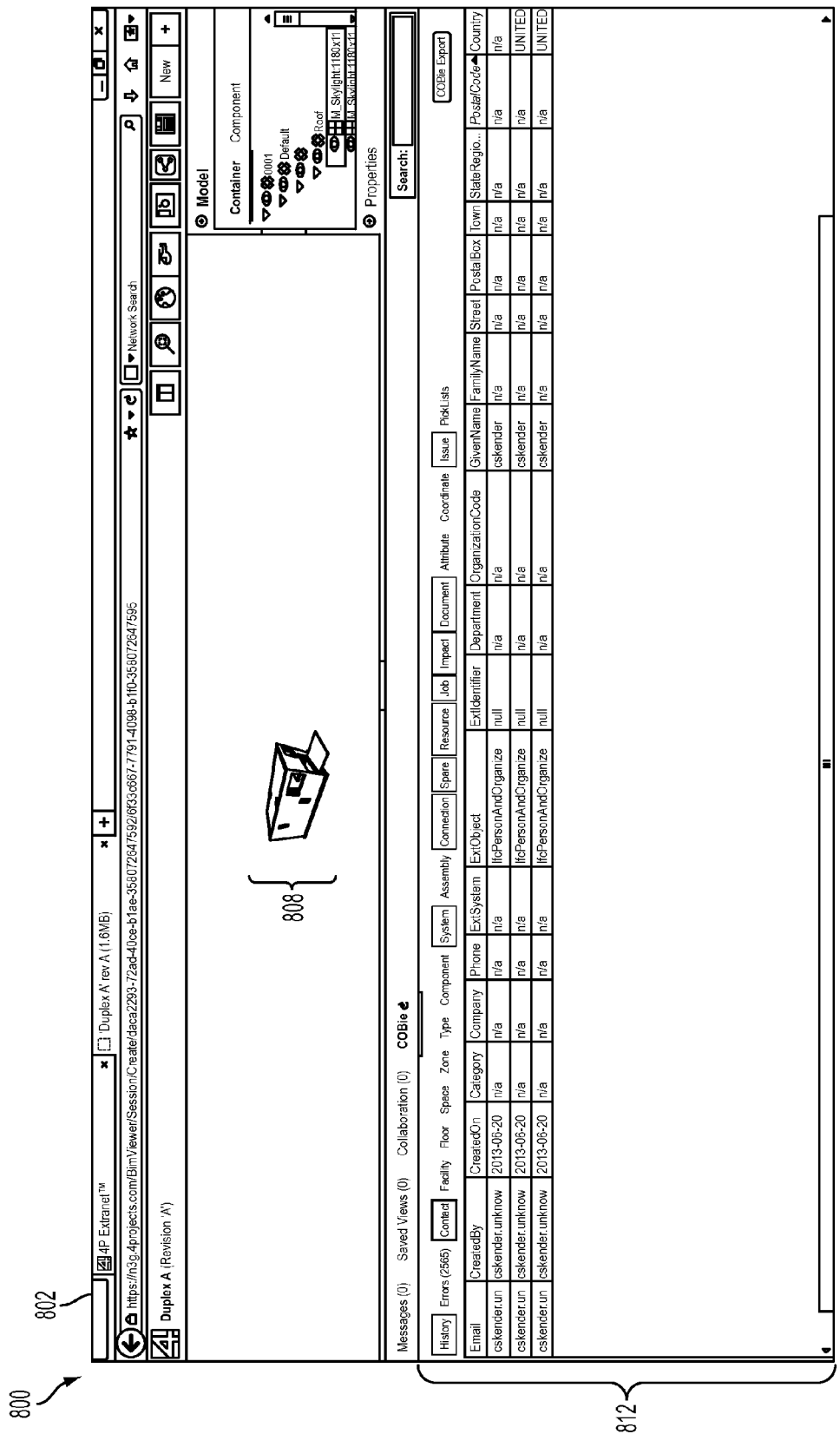
Figure 14:
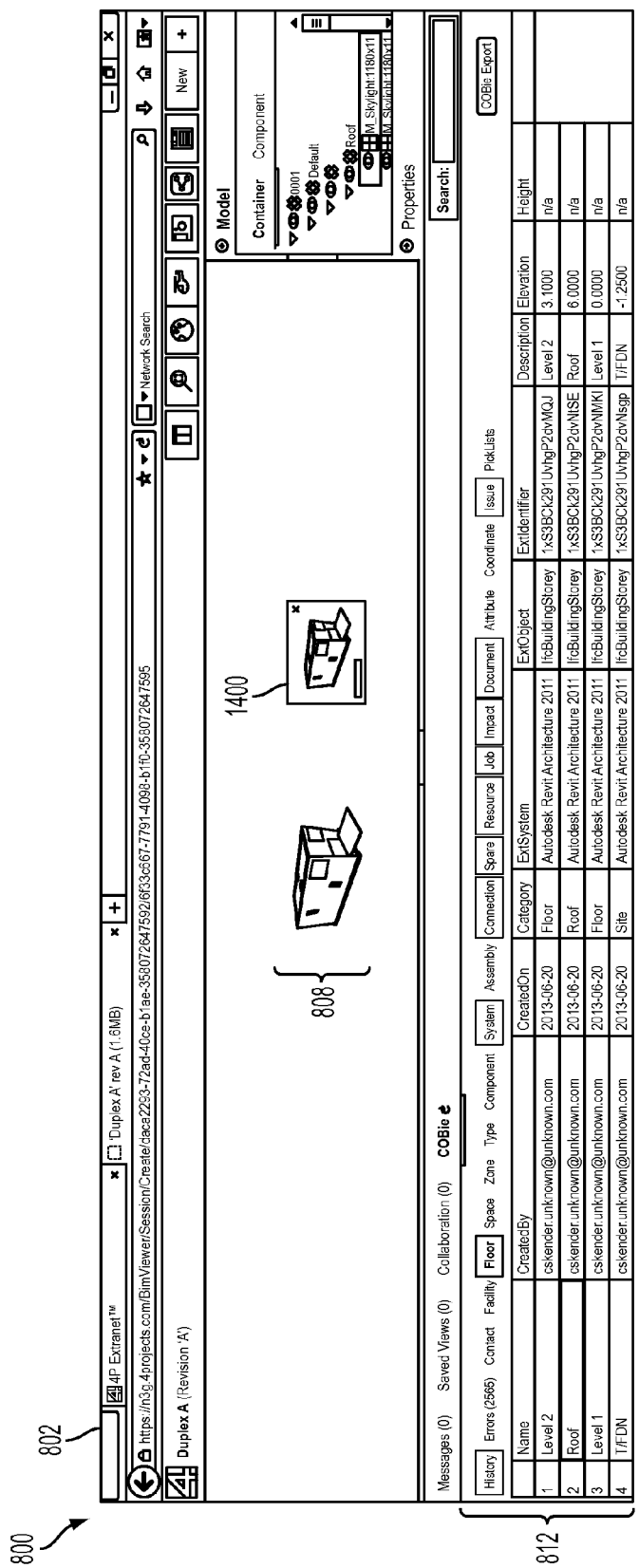

FIGS. 11-14 show other aspects of the GUI 800 in the browser window 802. Specifically, FIGS. 11-14 show different displayable options that can be viewed in the COBie spreadsheet 812 pertaining to items within the building model 808, matters and information pertaining to the building model, and information that may connect the building model to other building models. This information can be displayed in any order or arrangement in addition to other information that may also be pertinent to the user's purposes within the realm of variation that an individual of normal skill in the art would have access to. Specifically, FIGS. 11-12 show the COBie spreadsheet 812 populated with data related to components in the model. FIG. 13 shows the COBie spreadsheet 812 populated with data related to contacts associated with object in the model. FIG. 14 show the COBie spreadsheet 812 populated with data related to floors in the building model.

FIG. 14 additionally shows the use of saved screenshots 1400 and/or saved camera positions for quickly navigating the 3D model and for presentation purposes. It will be appreciated that a user if a client computing device may initiate saving the screenshots through interactive input with the GUI 800. In one example, the BIM engine may provide an item view deactivation option where individual objects may be selected in the hierarchical structure and made temporarily invisible in the 3D viewer for better viewing of the 3D building model.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for operation of a building information modeling (BIM) system, comprising:

at a BIM server, generating a network accessible graphical user interface (GUI) simultaneously displaying a 3-dimensional rendering of a building model, a hierarchical structure of building model data, and a Construction Operations Building Information Exchange (COBie) spreadsheet, where the building model, the hierarchical structure of building model data, and the COBie spreadsheet are associatively linked;

sending, from the BIM server, the 3-dimensional rendering of the building model, the hierarchical structure of building model data, and the COBie spreadsheet to a first client computing device;

sending, from the BIM server, the 3-dimensional rendering of the building model, the hierarchical structure of building model data, and the COBie spreadsheet to a second client computing device without reloading the 3-dimensional rendering of the building model in memory at the BIM server and while maintaining a shared data session between the BIM server and the first and second client computing devices-where instances of the network accessible GUI are accessed by the first and second client computing devices over a network;

at the BIM server, receiving a punch list image associated with an object in the hierarchical structure of building model data from a third mobile client computing device and storing the punch list image in a database; and associating, at the BIM server, the punch list image with the COBie spreadsheet and the 3-dimensional rendering of the building model by linking the punch list image with the data structures in the COBie spreadsheet, and the 3-dimensional rendering of the building model in response to receiving the punch list image.

2. The method of claim 1, further comprising, at the BIM server, altering data in each of the building model, the hierarchical structure of building model data, and the COBie spreadsheet in response to receiving an interactive input action from the first client computing device, the interactive input action indicating input device interaction with one of the building model, the hierarchical structure of building model data, and the COBie spreadsheet.

3. The method of claim 1, further comprising, at the BIM server, generating a network accessible mobile GUI including at least a portion of the hierarchical structure of building model data and, at the mobile client computing device, accessing the mobile GUI over the network.

4. The method of claim 1, where the COBie spreadsheet includes cells populated with COBie formatted data.

5. The method of claim 4, where the COBie spreadsheet includes one or more of an equipment list, a product data sheet, a warranty document, a spare parts list, and a preventive maintenance schedule color coded according to a predetermined standard.

6. The method of claim 1, where the building model includes 3-dimensional representations of a plurality of objects, the plurality of objects including a plurality of component systems and structures of a building.

7. The method of claim 6, where the plurality of component systems include one or more of a heating system, a plumbing system, a cooling system, and an electrical system, and the structures include one or more of a door, a room, and a wall.

8. A method for operating a building information modeling (BIM) system, comprising:
at a first client computing device, accessing over a network a graphical user interface (GUI) executed in a BIM server, the GUI simultaneously displaying a 3-dimensional rendering of a building model, a hierarchical structure of building model data, and a Construction Operations Building Information Exchange (COBie) spreadsheet, where the building model, the hierarchical structure of building model data, and the COBie spreadsheet are associatively linked, and the GUI is accessed without reloading the 3-dimensional rendering of the building model at the BIM server and while maintaining a shared data session between the BIM server and the first client computing device and a second client computing device where instances of the GUI are accessed by the first and second client computing devices over a network;
receiving, at the BIM server, a punch list image associated with an object in the hierarchical structure of building model data from a third mobile client computing device and storing the punch list image in a database; and
associating, at the BIM server, the punch list image with the COBie spreadsheet and the 3-dimensional rendering of the building model by linking the punch list with data structures in, the COBie spreadsheet, and the 3-dimensional rendering of the building model in response to receiving the punch list image, where the linking occurs by associating a common identifier included in the punch list with the data structures in, the COBie spreadsheet, and the 3-dimensional rendering of the building model.

9. The method of claim 8, further comprising, at the BIM server, altering data in each of the building model, the hierarchical structure of building model data, and the COBie spreadsheet in response to receiving an interactive input action at the first client computing device, the interactive input action indicating input device interaction with one of the building model, the hierarchical structure of building model data, and the COBie spreadsheet.

10. The method of claim 8, where the first client computing device is a master client computing device permitted to alter data in each of the building model, the hierarchical structure of building model data, and the COBie spreadsheet.

11. The method of claim 8, where the second client computing device is a slave client computing device inhibited from altering data in each of the building model, the hierarchical structure of building model data, and the COBie spreadsheet.

12. The method of claim 8, further comprising, at the first client computing device, sending a viewing angle adjustment request of the 3-dimensional rendering of the building model to the BIM server and, at the BIM server, in response to receiving the viewing angle adjustment request, sending an updated viewing angle of the 3-dimensional rendering of the building model to the first client computing device.

13. The method of claim 12, further comprising, at the BIM server, sending the updated viewing angle of the building model to the second client computing device, wherein the updated viewing angle includes coordinate data.

14. A building information modeling (BIM) system comprising:
a BIM server configured to:
generate a network-based BIM engine accessible by a plurality of client computing devices over a network, the network-based BIM engine generating a graphical user interface (GUI) including a 3-dimensional rendering of a building model, a hierarchical structure of building model data, and a Construction Operations Building Information Exchange (COBie) spreadsheet, where the building model, the hierarchical structure of building model data, and the COBie spreadsheet are associatively linked;
send the 3-dimensional rendering of the building model, the hierarchical structure of building model data, and the COBie spreadsheet to a first client computing device;
send the 3-dimensional rendering of the building model, the hierarchical structure of building model data, and the COBie spreadsheet to a second client computing device without reloading the 3-dimensional rendering of the building model at the BIM server and while maintaining a shared data session between the BIM server and the first and second client computing devices where instances of the GUI are accessed by the first and second client computing devices over a network;
receive a punch list image associated with an object in the hierarchical structure of building model data from a third mobile client computing device and storing the punch list image in a database; and
associate the punch list image with the COBie spreadsheet and the 3-dimensional rendering of the building model by linking the punch list image with the data structures in the COBie spreadsheet, and the 3-dimensional rendering of the building model in response to receiving the punch list image;
where the first client computing device is in electronic communication with the BIM server via the network and receives the 3-dimensional rendering of the building model, the hierarchical structure of building model data, and the COBie spreadsheet; and where the second client computing device receives the 3-dimensional rendering of the building model, the hierarchical structure of building model data, and the COBie spreadsheet.

15. The BIM system of claim 14, where the BIM server is configured to alter data in each of the building model, the hierarchical structure of building model data, and the COBie spreadsheet in response to receiving an interactive input action from the first client computing device, where the interactive input action indicates input device interaction with one of the building model, the hierarchical structure of building model data, and the COBie spreadsheet.

16. The BIM system of claim 14, where the first client computing device is a master client computing device configured to control the network-based BIM engine and the second client computing device is a slave client computing device configured to passively view the GUI.

17. The method of claim 1, where the punch list image is an image of the object in the building model requiring maintenance or repairs.

* * * * *